United States Patent [19]

Beauducel et al.

[11] 4,426,624
[45] Jan. 17, 1984

[54] DEVICE AND METHOD FOR AMPLIFYING AND SAMPLING MULTIPLEXED SIGNALS

[75] Inventors: Claude Beauducel, Henouville; Jacques Cretin, Le Chesnay, both of France

[73] Assignees: Institut Francais du Petrole, Rueil-Malmaison; Compagnie Generale de Geophysique, Massy, both of France

[21] Appl. No.: 286,323

[22] Filed: Jul. 24, 1981

[30] Foreign Application Priority Data

Jul. 25, 1980 [FR] France ................................ 80 16550

[51] Int. Cl.³ ............................................. H03G 3/20
[52] U.S. Cl. ..................................... 330/86; 330/279; 330/282
[58] Field of Search ................. 330/86, 144, 149, 150, 330/278, 279, 310, 282

[56] References Cited

PUBLICATIONS

Granata et al., "Sample and Hold Gain Selectable Amplifier", IBM Technical Bulletin, vol. 11, No. 3, Aug. 1968.

Primary Examiner—James B. Mullins
Assistant Examiner—Gene Wan
Attorney, Agent, or Firm—Millen & White

[57] ABSTRACT

An amplification and sampling device for multiplexed analog signals comprises a continuous chain of amplification elements, means for giving to each of said elements a gain selected from a predetermined set of values, sample-and-hold units for memorizing the amplified voltages available at the output of said elements, means for correcting the drift or noise voltage of the amplification chain and selection means for applying to the amplification chain the samples of the multiplexed analog signals or the voltages memorized in the sample-and-hold units, in accordance with the voltage level obtained at the output of the amplification chain as compared with reference voltages.

16 Claims, 3 Drawing Figures

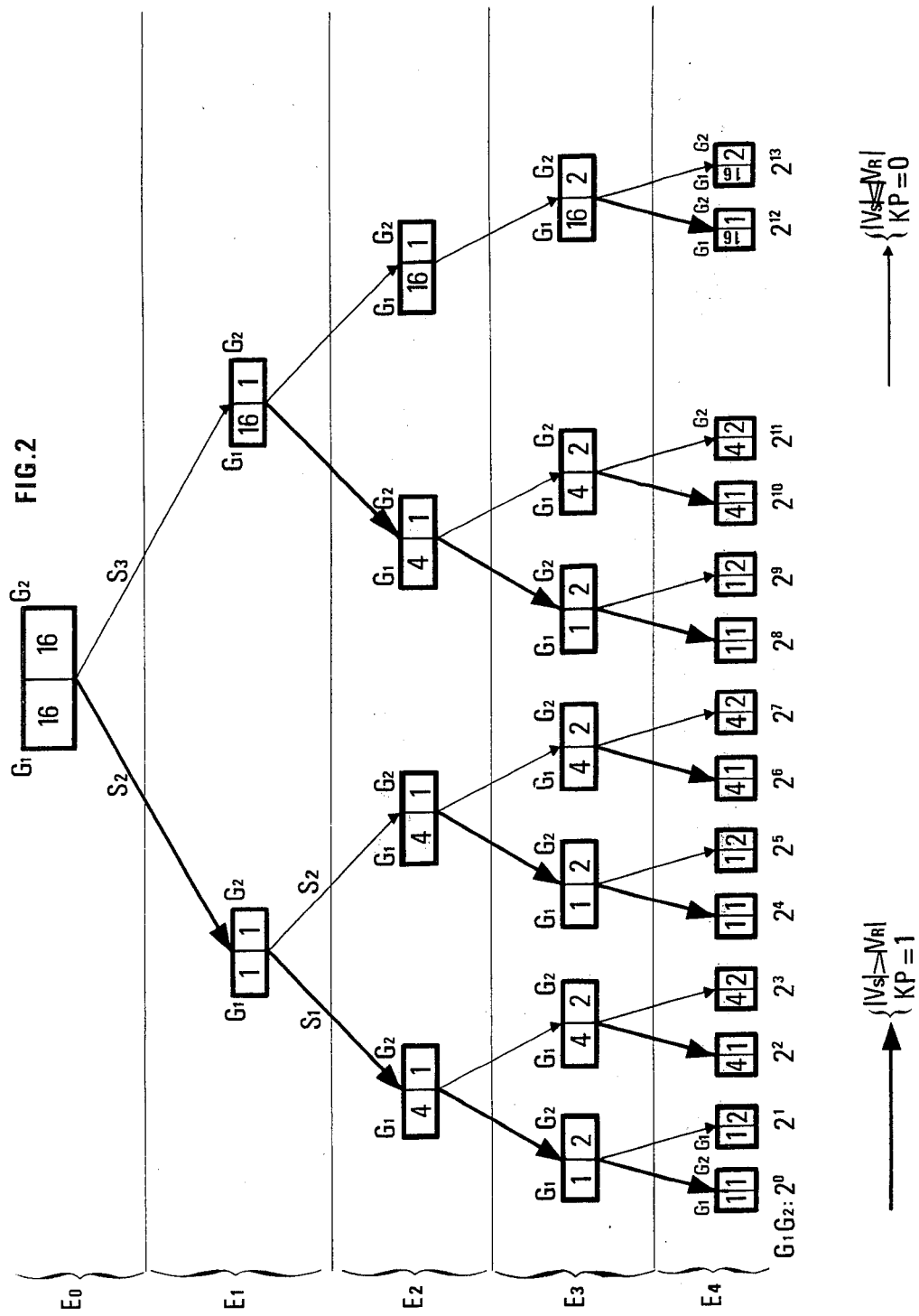

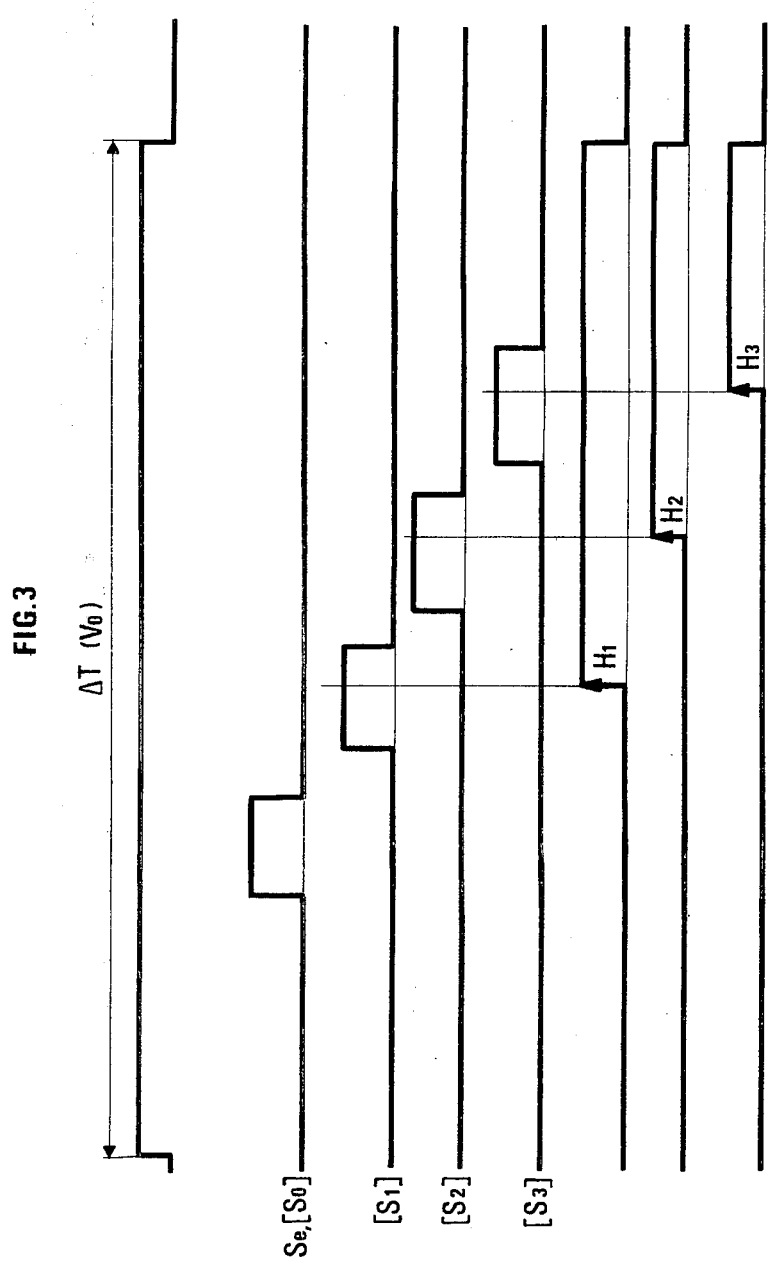

DEVICE AND METHOD FOR AMPLIFYING AND SAMPLING MULTIPLEXED SIGNALS

BACKGROUND OF THE INVENTION

This invention relates to a device for amplifying and sampling multiplexed analog signals having a wide dynamic range of variations, i.e., whose level is liable to vary to a large extent.

The device according to the invention is particularly suitable for incorporation in a seismic data acquisition chain between a multiplexer and an analog-to-digital converter.

According to a known prior art process, the seismic signals issued from each geophone or geophone group are directly supplied to the inputs of an analog multiplexer after preliminary amplification in a preamplifier of fixed gain. The output of the multiplexer, where there are available the successive signals representing the samples, is connected to a single amplifier made up of a chain of serially-arranged amplifying elements, and with the output of each element being connected to the input of the next element. The gain of each amplification element is fixed and is preferably an integral power of the number two.

Since the difference in amplitude between two successive samples may be very high, a selection member is used to select the number of amplification units wherethrough each signal has to pass in order to reach an optimum level, and to switch the output of the amplification element where this signal is available onto the input of an analog-to-digital converter which is connected to a recording system. According to a first embodiment, described for example, the French Pat. No. 2,110,758, all the amplification elements have an identical gain. According to a second embodiment, the gains of the different amplification elements of the chain are different from one another and their values are selected from the successive powers of the number 2. An example of another arrangement, described in French Pat. No. 2,373,914, relates to an n-stage amplifier, wherein the gain value of any amplification stage is equal to the square of the gain value of the preceding amplification stage.

The amplifiers made up of a series of serially interconnected amplification elements suffer from a number of disadvantages:

They are relatively slow since the delays introduced by the different amplification elements wherethrough the signals have to pass are cumulative;

the effects of the relative slowness of response of each amplification element, when operated with pulses, characterized by its voltage increase rate and, accumulated over all the chain of serially-connected elements, tends to reduce the overall speed of response of the amplifier;

the time required for the gain selection member to select the output of the stage where the amplitude of the amplified sample is optimum, is proportional to the length of the amplification chain;

when it is desired to shorten the amplification chain by increasing the gain of each stage, it becomes necessary to make use of an analog-to-digital converter capable of processing longer digital words in order to maintain the same accuracy;

it may be further observed that the amplification elements are likely to become saturated by the passage of a sample of low amplitude followed by a sample of substantially higher amplitude.

In addition, a further disadvantage of the data acquisition chains having a head multiplexer, is that, in order to memorize a sample value during the period of gain selection, it becomes necessary to make use of a memory element, well known in the art as sample-and-hold unit, connected before the amplifier and, consequently, as a result of operating with signals in a wide dynamic range, the memory element must be capable of memorizing signals of high level as well as signals of low level. However, a known disadvantage of the sample-and-hold units which are available in practice, comes from the fact that they cannot successively memorize two samples without interaction of one of them on the other (i.e., diaphony or cross talk phenomenon), and that the memorized value of the sample amplitude, consequently, is not independent from the memorized value of the amplitude of the preceding sample. The errors due to the diaphony being applied to the input of an amplifier may be amplified with a gain equal to the maximum gain of the amplification chain. Moreover, sample-and-hold units are generally formed of a memorization capacitor and two buffer amplification elements which make the amplification chain longer. Accordingly, at least six amplification elements are required to form the amplifier.

SUMMARY OF THE INVENTION

The device according to the invention avoids the above-mentioned disadvantages. It comprises an amplification chain provided with several serially-interconnected amplification elements whose gains may be selected with different predetermined values by closing switches, and means for generating electric voltages depending on the sign of the drift or noise voltage issued from the amplification chain and for applying correction voltages. It provides advantages in that it comprises sampling-and-holding means whose inputs are permanently connected respectively to the outputs of the elements of the amplification chain, switching means for applying the samples of multiplexed signals, or the voltages memorized by the sample-and-hold means, to the amplification chain, and selection means adapted to select the convenient switching means, by mere comparison between the output voltage of the amplification chain and reference voltages, and to control said selected switching means as well as the sample-and-hold means.

According to a preferred embodiment, only two amplification elements are used whose gain may have predetermined values at most equal to 16 and nevertheless, all the gain values ranging from 1 to $16^4$ are obtained by making use of a suitable sequence of amplifications which will be described hereinafter.

Thus, the use of a long chain of serially arranged amplification elements, or of a shorter amplification chain of high gain associated to a more complex converter, is avoided. In addition, the use of sample-and-hold means respectively connected to the output of the chain amplification elements, whose outputs may be selectively connected to the input of one of the amplification elements, makes it possible to avoid using a head sample-and-hold unit serially connected with the amplification elements.

This arrangement also permits reducing to a minimum the effect of factors due to the diaphony (cross-talk) phenomenon occurring between successive samples.

BRIEF DESCRIPTION OF THE DRAWINGS

Other features and advantages will become apparent from the description of a particular non-limitative embodiment of the invention given with reference to the accompanying drawings wherein:

FIG. 2 shows a selection diagram of the gains assigned to the amplification elements, during each amplification sequence of an analog signal sample and;

FIG. 3 is a signal chronogram generated by the selection means during the phase of cyclic measurement of the drifts affecting the amplification chain.

DETAILED DISCUSSION OF THE INVENTION

Figure 1:
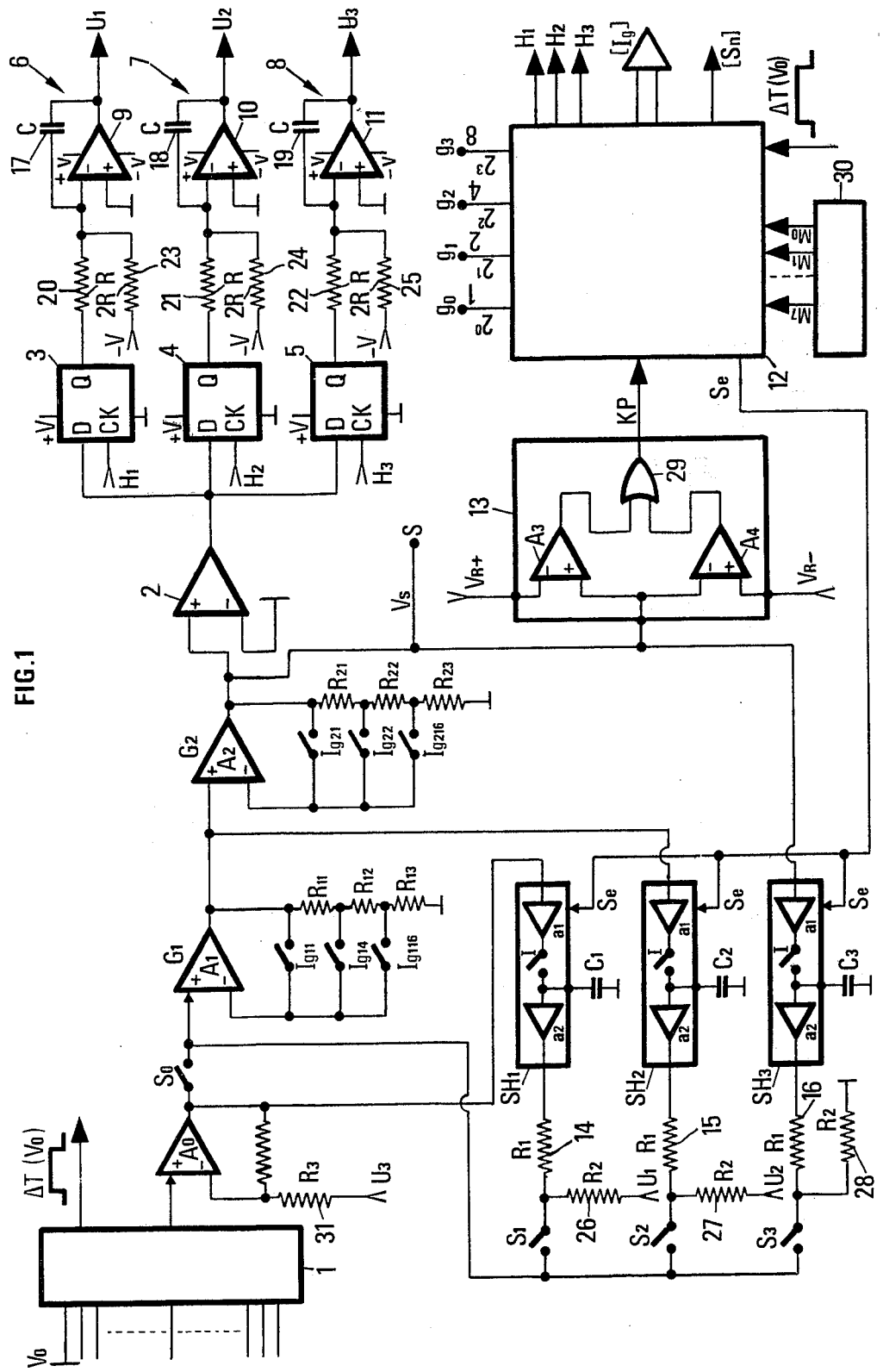
FIG. 1 is a schematic diagram showing the assembly of the amplification and sampling device according to the invention.

The signals amplifying and sampling device is connected, for example, to the output of a multiplexer 1 (FIG. 1). This device comprises an amplification chain comprising an isolating operational amplifier or buffer-amplifier $A_0$, whose gain is substantially equal to one. Its non-inverting input is connected to the output of multiplexer 1 and its output is connected, through a switch $S_0$, to the non-inverting input of a first amplification element comprising an operational amplifier $A_1$. The output of amplifier $A_1$ is grounded through three serially-connected resistors $R_{11}$, $R_{12}$ and $R_{13}$. The inverting input of amplifier $A_1$ is connected to the output thereof through a switch $Ig_{11}$, to the junction point of resistors $R_{11}$ and $R_{12}$ through a switch $Ig_{14}$ and to the junction point of resistors $R_{12}$ and $R_{13}$ through a switch $Ig_{116}$. The three resistors $R_{11}$, $R_{12}$, $R_{13}$ and the three switches $Ig_{11}$, $Ig_{14}$ and $Ig_{116}$ form a conventional feedback network whereby the amplifier $A_1$ may be given a gain of unity, four or sixteen. The output of amplifier $A_1$ is connected to the non-inverting input of an operational amplifier $A_2$, forming the second amplification element, whose output is grounded through three serially-connected resistors $R_{21}$, $R_{22}$, $R_{23}$. The inverting input of amplifier $A_2$ is connected to the output thereof through a switch $Ig_{21}$, to the junction point of resistors $R_{21}$ and $R_{22}$ through a switch $Ig_{22}$, and to the junction point of resistors $R_{22}$ and $R_{23}$ through a switch $Ig_{216}$. Similarly, resistors $R_{21}$, $R_{22}$, $R_{23}$ and switches $Ig_{21}$, $Ig_{22}$ and $Ig_{216}$ form a feed-back network whereby the amplifier $A_2$ may be given a gain of one, two or sixteen. The output of amplifier $A_2$ is also the output S of the amplification chain. The outputs of amplification elements $A_0$, $A_1$ and $A_2$ are respectively connected to the inputs of three sample-and-hold circuits $SH_1$, $SH_2$, $SH_3$ of a known type, included, for example, in the integrated circuits manufactured by "P.M.I." under reference SMP 11 and by "National Semi Conductor" under reference LF 198. These references are of course not limitative. These sample-and-hold circuits $SH_1$, $SH_2$, $SH_3$, each comprise two amplifiers $a_1$ and $a_2$ which are serially interconnected through a switch I, have a first terminal to which is connected a terminal of a memorizing capacitor (respectively $C_1$, $C_2$, $C_3$), whose other terminal is grounded, and a second terminal supplied with a signal $S_e$ generated by a selection means, which controls the intermittent memorization in capacitors $C_1$, $C_2$, $C_3$, respectively, of the output voltages of the amplification elements $A_0$, $A_1$, $A_2$ at the beginning of each amplification step. The outputs of circuits $SH_1$, $SH_2$, $SH_3$ are respectively connected, through resistors 14, 15, 16 of resistance $R_1$ and through switches $S_1$, $S_2$, $S_3$, to the non-inverting input of the amplification element $A_1$. The assembly of switches $S_0$, $S_1$, $S_2$, $S_3$ form the switching means. The use of sample-and-hold units consisting of complex circuits is very advantageous in view of the fact that:

Capacitors $C_1$, $C_2$, $C_3$ are not charged directly by the amplification elements $A_0$, $A_1$, $A_2$ but by separating amplifiers $a_1$ of controlled voltage. It is thus possible to avoid the cumulative delays affecting the response time of serially-interconnected amplification elements when they must directly feed memorization capacitors;

Capacitors $C_1$, $C_2$, $C_3$ are isolated from switches $S_1$, $S_2$, $S_3$ through amplifiers $a_2$ which avoid the influence of these switches on the memorized voltages.

The output of the amplification element $A_2$ is connected to the non-inverting input of a comparator 2, whose inverting input is grounded. The output of comparator 2 is connected to the control inputs of memorization elements, consisting in this case of three bistable flip-flops 3, 4, 5, actuated on their input terminal (D). The voltages available at the outputs referenced (Q) of these three flip-flops respectively feed three integrators 6, 7, 8, each comprising, in a conventionally arranged manner, an operational amplifier (respectively 9, 10, 11) associated with a passive circuit R, C, the inverting imput of each amplifier being connected to the output thereof through a capacitor of capacitance C (17, 18, 19 respectively) on the one hand, and to the output (Q) of the corresponding flip-flop (3, 4, 5) through a resistor of resistance R (20, 21, 22 respectively) on the other hand. For a practical reason, which is the feeding of the flip-flops with a voltage V, whereas the amplifiers of the device are fed with symmetrical voltages $+V$ and $-V$, the junction point of the R and C elements (17 and 20, 18 and 21, 19 and 22 respectively) is connected to the negative side of the feeding circuit $(-V)$ through a resistor of resistance 2R (23, 24, 25 respectively). The respective control inputs (CK) of flip-flops 3, 4, 5 receive validation pulse signals $H_1$, $H_2$, $H_3$, produced by a selection assembly (12). The signals $U_1$, $U_2$, respectively available at the output terminals of integrators 6 and 7, are respectively applied to the connection point between switch $S_1$ and resistor 14 and to the junction point of switch $S_2$ and resistor 15, respectively through resistors 26 and 27 of resistance $R_2$. The signal $U_3$, available on the output terminal of integrator 8, is applied to the inverting input of the isolating amplifier $A_0$ through a resistor 31 of resistance $R_3$. The connection point of switch $S_3$ and resistor 16 is earthed through a resistor 28 of resistance $R_2$. The comparator 2 and the flip-flops (3, 4, 5) form the control means for the integrators.

The output of amplification element $A_2$ is connected to the input of a comparison element 13 of a known type, comprising, for example, two amplifying comparators $A_3$, $A_4$, adapted to compare the output voltage $V_S$ of the amplification chain with two reference voltages of the same absolute value, one positive $V_{R+}$ and the other negative $V_{R-}$. The outputs of the amplifying comparators $A_3$, $A_4$ are connected to the inputs of an OR gate 29. The signal KP delivered by this gate differs in accordance with the fact that the value of the chain output signal ranges between two symmetrical reference voltages $V_{R+}$, $V_{R-}$ or is higher than $V_{R+}$ or lower than $V_{R-}$. Conventionally, the signal KP will have a logic value 1 when $|V_S| > |V_R|$ and a logic value 0 when $|V_S| \leq |V_R|$, $|V_R|$ being the common absolute value of the voltages $V_{R+}$ and $V_{R-}$.

The selection assembly 12 is connected to a clock-member 30 adapted to generate cyclic pulses $M_0$, $M_1$, $M_2$ . . . $M_7$ defining instants at intervals from one another and also to the output of the comparator 13 delivering the control signal KP. The selection assembly 12, formed of interconnected logic elements, is adapted to generate signals for controlling switches $Ig_{11}$ to $Ig_{116}$ and $Ig_{21}$ to $Ig_{216}$, switches $S_0$ to $S_3$, sample-and-hold means $SH_1$, $SH_2$, $SH_3$ and flip-flops 3, 4, 5 of the device, in accordance with the selection diagram of FIG. 2 and the sets of logic functions $E_0$ to $E_4$, defined later. It is also adapted to memorize the values, expressed as binary numbers, of the gain applied to each of the successive samples and to deliver them on the four outputs $g_0$, $g_1$, $g_2$, $g_3$ of respective binary weights 1, 2, 4 and 8. The comparison element 13, the selection assembly 12 and the clock-member form the selection means.

The operation, as described hereinafter, of the amplification and sampling device controlled by the selection assembly 12 is illustrated by the selection diagram of FIG. 2. Each amplification cycle of a signal sample comprises:

a preliminary step $E_0$ of sampling wherein voltages corresponding to the input voltage to which are respectively applied amplification gains of 1, 16 and 256, are respectively applied to the sample-and-hold means $SH_1$, $SH_2$ and $SH_3$;

four subsequent stages $E_1$, $E_2$, $E_3$ and $E_4$ of memorizing and selectively applying one of the memorized voltages to the assembly of the amplification elements $A_1$, $A_2$. During these four stages, the gain to be applied to these two amplification elements is selected so as to obtain an optimum output voltage compatible with the maximum level required by the following elements (for example, an analog-to-digital converter).

In the following description, the control signal of any switch S ($S_0$ to $S_3$ or $Ig_{21}$ to $Ig_{216}$) will be designed by [S] or [Ig] with the convenient numerical index. When this signal has the logic value 1, the switch controlled therewith will be switched on (i.e., closed). Conversely, the logic value 0 will correspond to its opening. It is recalled that, conventionally, [KP]=1 means that $|V_S| > |V_R|$ and that [KP]=0 means that $|V_S| \leq |V_R|$.

The operation of the device may be described more in detail as follows:

The purpose being to amplify the sampled signal to such an extent as to obtain a voltage comprised within a preselected range ($V_{R-}$ to $V_{R+}$), the processing of the samples will be effected in successive steps as follows:

STEP $E_0$ (see FIG. 2)

Multiplexer 1 is switched on a determined reception channel;

Sampling is performed. The selection assembly 12 controls the closure of switch $S_0$ and of switches $Ig_{116}$ to $Ig_{216}$ and generates signal $S_e$ for controlling, through the closure of switches I, the sampling of the signals available on the outputs of the amplification elements $A_0$, $A_1$, $A_2$.

Step $E_0$ may be summarized by the following logic equations:

$$E_0 \begin{cases} [Ig_{116}] = 1 \; [Ig_{216}] = 1 \; [S_0] = 1 \; S_e = 1 \\ [Ig_{11}] = [Ig_{14}] = [Ig_{21}] = [Ig_{22}] = [S_1] = [S_2] = [S_3] = 0 \end{cases}$$

STEP $E_1$

A first comparison is effected between the output signal $V_S$ and the reference voltages $V_{R+}$ and $V_{R-}$ and the signal KP takes the value $KP_0$; then the selection assembly 12 controls the closure of switch $Ig_{21}$, the opening of switch $S_0$, and controls, by signal $S_e$ which disconnects the samplers $SH_1$, $SH_2$, $SH_3$ from the amplifiers $A_0$, $A_1$ and $A_2$, the memorization of the output voltages of amplifiers $A_0$, $A_1$ and $A_2$ in capacitors $C_1$, $C_2$ and $C_3$. The logic values of signals $[S_2]$ and $[S_3]$ controlling the switches $S_2$ and $S_3$ depend on the logic value [KP] of signal KP issued from the comparator. Conventionally $[\overline{KP}]$ is the complementary logic signal of signal [KP].

These operations form step $E_1$ which may be summarized by the following logic equations:

$$E_1 \begin{cases} [Ig_{21}] = 1 \\ [S_0] = S_e = [S_1] = [Ig_{22}] = [Ig_{216}] = [Ig_{14}] = 0 \\ [Ig_{116}] = [S_3] = [\overline{KP_0}] \\ [Ig_{11}] = [S_2] = [KP_0] \end{cases}$$

In the case, for example, where $[KP_0]=0$, the switch $Ig_{11}$ will be open, the switch $Ig_{116}$ being closed. As $Ig_{21}$ is closed, the total amplification rate in such a case is equal to 16.

It is obvious that in the opposite case where $[KP_0]=1$, the total amplification gain of the chain would be 1, as shown by the above logic equations.

STEP $E_2$

A second comparison of signal $V_S$ with values $V_{R+}$ and $V_{R-}$ is effected and the signal KP takes the value $KP_1$. The selection assembly 12 maintains the switch $S_0$ in off position and the sample-and-hold units $SH_1$, $SH_2$ and $SH_3$ in hold position, closes the switch $Ig_{21}$, maintains the switch $S_3$ in the position given thereto in the preceding step, and actuates switch $Ig_{14}$ and switches $S_1$ and $S_2$ in accordance with the values of $KP_1$ and $[S_3]$. When $[Ig_{14}]=0$, the gain assigned to the amplification element $A_1$ during the preceding step is not changed. These operations constitute step $E_2$ which may be summarized by the following logic equations:

$$E_2 \begin{cases} [Ig_{21}] = 1 \\ [Ig_{14}] = [\overline{S_3}] + [\overline{KP_1}] \\ [S_3]_{E_2} = [S_3]_{E_1} \\ [Ig_{22}] = [Ig_{216}] = [S_0] = S_e = 0 \\ [S_2] = [\overline{KP_1}] \cdot [S_2]_{E_1} \\ [S_1] = [KP_1] \cdot [S_2]_{E_1} \end{cases}$$

In the case where, for example, $[KP_1]=0$, the logic equations of step $E_2$ indicate that the switch $Ig_{14}$ will be closed. As $Ig_{21}$ is also closed, the total amplification gain will be 4.

STEP E₃

After a third comparison of the output signal $V_S$ with the values $V_{R+}$ and $V_{R-}$ where signal KP takes a new value KP₂, the selection assembly closes the switch $I_{g22}$, maintains the switch $I_{g116}$ in its preceding state, as well as the sample-and-hold units and the switch $S_0$, and actuates the switches $I_{g11}$ and $I_{g14}$ according to the values of $[KP_2]$ and $[I_{g116}]$.

These operations constitute the step E₃ which may be summarized by the following logic equations:

$$E_3 \begin{cases} [I_{g22}] = 1 \\ [I_{g116}]_{E_3} = [I_{g116}]_{E_2} \\ [I_{g21}] = [I_{g216}] = [S_0] = S_e = 0 \\ [I_{g11}] = [KP_2] \\ [I_{g14}] = [\overline{KP_2}] \cdot [\overline{I_{g116}}] \end{cases}$$

In the case where $[KP_2]=0$, for example, the logic equations of step E₃ indicate that switch $I_{g14}$ will be closed. The switch $I_{g22}$ being closed, the total amplification gain of the chain will be 8.

STEP E₄

A last comparison is effected between the output voltage $V_S$ and the reference values, and signal KP takes the new value KP₃. The selection assembly 12 actuates the switch $I_{g21}$ or $I_{g22}$ according to the logic value of KP₃ while maintaining the other signals unchanged. The logic equations defining step 4 are the following:

$$E_4 \begin{cases} [I_{g21}] = [KP_3] \\ [I_{g22}] = [\overline{KP_3}] \\ [I_{g11}]_{E_4} = [I_{g11}]_{E_3} \\ [I_{g14}]_{E_4} = [I_{g14}]_{E_3} \\ [I_{g116}]_{E_4} = [I_{g116}]_{E_3} \\ [S_0] = S_e = [I_{g216}] = 0 \end{cases}$$

When $[KP_3]=0$, for example, the switches $I_{g14}$ and $I_{g22}$ are closed, and the total amplification gain of the chain will be 8, as indicated by the logic equations of step E₄.

This sequence of successive comparisons and switchings provides for the application to the output voltage $V_S$ of a maximum gain $G=G_1G_2$ selected from the successive powers of number 2 in the range from $2^0$ to $2^{13}$ (see FIG. 2), compatible with its ranging between the values defined by the reference voltages $V_{R-}$ and $V_{R+}$.

The sequence of comparison and adjustment of gains $G_1$ and $G_2$ is repeated for all the successive signal samples delivered by multiplexer 1 except for the reference channel which is earthed grounded. During the time interval at ($V_0$) where the reference voltage $V_0$, having for example, a zero value, is applied to the input of the amplification chain, a correction cycle is performed for compensating for the drift or noise voltages. In the time interval $\Delta T$, the selection assembly 12 generates (FIG. 3) control pulses $[S_0]=[I_{g116}]=[I_{g216}]=S_e=1$, making possible the sampling and holding of the reference voltage $V_0=0$ amplified by the three elements of the amplification chain $A_0$, $A_1$ and $A_2$ with respective gains $G_0=1$, $G_1=16$, $G_2=16$ in the sample-and-hold units $SH_1$, $SH_2$ and $SH_3$. Then, the selection assembly 12 successively generates pulses for controlling the sequence of closure of the switches $S_1$, $S_2$ and $S_3$. During these pulses, the selection assembly 12 successively generates validation pulse signals $H_1$, $H_2$, $H_3$. These successive validation signals authorize the memorization of the values taken at these instants by the output voltage issued from comparator 2, respectively in the flip-flops 3, 4 and 5. When the output signal $V_S$ is positive at the beginning of the validation signals $H_1$, $H_2$ or $H_3$, the output (Q) of the controlled flip-flop will take the logic value 1. On the contrary, when the signal $V_S$ is negative at one or the other of these instants, the output (Q) of the controlled flip-flop will take the logic value 0.

The integrators (6, 7 or 8) transform the discontinuous voltage levels imparted to the outputs (Q) of the flip-flops into linearly varying, progressively increasing or decreasing voltages $U_1$, $U_2$ and $U_3$ respectively, which are applied to switches $S_1$ and $S_2$ (see FIG. 1) through resistors (26, 27) and to the inverting input of the isolating amplifier $A_0$ through resistor 31 during the whole duration of the successive cycles of sampling all the channels of multiplexer 1 and provide for the compensation of the drifts to which are subjected the amplification elements. The effects of the compensation system may be adjusted by acting on the time constant of the integrators.

Generally, the use of linearly varying correction voltages has the effect of reversing the sign of the drift voltage to which is subjected the amplification chain, as observed at the end of the next sampling cycle, which results in a change of the sign of variation of the correct voltages $U_1$, $U_2$ and $U_3$.

Although the correction system does not provide for the permanent nullification of the drift voltage and of the background noise at low frequency of the amplification chain, but only for a compensation in the vicinity of the zero value, its performance is very efficient. As a matter of fact, by convenient adjustment of the time constant of the integrators, it is easy to reduce the parasitic voltages to a value always lower than the background noise of the acquisition chain within a frequency band higher than the sampling frequency.

What is claimed is:

1. A device for amplifying and sampling multiplexed analog signals, comprising: a continuous amplification chain made up of plural serially interconnected amplification elements adapted for having their gains selectively varied to one of plural predetermined values by means of plural different feed back circuits arranged for being connected therewith by first switching means; memory means for memorizing amplified voltages from said amplification elements, and associated with second switching means for applying either the multiplexed analog signals or the memorized voltages to one of said amplification elements, and wherein said memory means comprises plural sample-and-hold means having their inputs permanently connected respectively to the respective outputs of said amplification elements of said amplification chain; and said device further comprising selecting means adapted for selecting the condition of said first and second switching means as a function of a comparison made by said selecting means between the output voltage of the continuous amplification chain and two reference voltages generated by said selecting means, said two reference voltages being respectively positive and negative, and said selecting means further adapted for controlling the operation of said first and second switching means, and of said sample-and-hold means, to give an optimum gain to the continuous amplification chain for amplifying the individual multiplexed analog signals.

2. A device according to claim 1, wherein said selecting means comprises a comparison element for comparing the output voltage of said amplification chain with two reference voltages of same absolute value, and of different signs; an assembly of logic elements connected to the output of the comparison element; and a clock element.

3. A device according to claim 1, wherein said sample-and-hold means comprises memorization capacitors associated with one set of switches, connected between input amplifiers whose inputs are permanently connected to the respective outputs of the elements of the amplification chain, and output amplifiers whose outputs are connected through another set of switches to the input of the amplification chain.

4. A device according to claim 1, wherein said amplification chain comprises a first amplification element and a second amplification element adapted for having their gains selectively given three different predetermined values by the switching of said first switching means, said first and second amplification elements being serially interconnected and preceded by a buffer amplifier, and wherein said sample-and-hold means comprises three sample-and-hold units whose inputs are permanently connected respectively to the outputs of the buffer amplifier and of the first and second amplification elements, and whose outputs are selectively connected through switches to the input of the first amplification element.

5. A device according to claim 4, further comprising voltage generating means for generating electric voltages of a value which is a function of the sign of the drift or noise voltage issued from the amplification chain, said voltage generating means including plural integrators whose output voltages are applied through resistors to inputs of the buffer amplifier and of the first amplification element, and control means for controlling the integrators, said control means being connected to the output of the amplification chain and actuated by said selecting means for applying successively to the integrators, calibrated signals of predetermined duration whereby the voltages generated by these integrators compensate for the drift and noise voltage.

6. A device according to claim 4, further comprising voltage generating means for generating electric voltages which are a function of the sign of the drift or noise voltage issued from the amplification chain, said voltage generating means including a comparator for determining the sign of errors affecting the output voltage of the amplification chain when a reference voltage is applied to the input thereof, three integrators whose output signals are intermittently applied through resistors to an inverting input of the buffer amplifier and of the first amplification element, and control means adapted for selectively applying to said integrators a constant voltage which is memorized, during the time intervals between the successive moments of application of said reference voltage at the input of the amplification chain, upon validation by pulse signals generated by said selecting means.

7. A device according to claim 6, wherein the input of said buffer amplifier is permanently connected to the output of a multiplexing member having one input to which is applied said reference voltage.

8. A device according to claim 6, wherein the second switching means comprises a switch connected between the buffer amplifier and the input of the first amplification element, which is given by a feedback network a gain of $2^0$, $2^1$, or $2^4$, by the selective closure of three switches, and the second amplification element is given by a second feed back network a gain of $2^0$, $2^1$, or $2^4$, by the selective closure of three other switches, and wherein said control means comprises bistable flip-flops actuated by the selecting means for registering the output voltage of a comparator whose input is connected to the output of the amplification chain.

9. An amplification and sampling device adapted for amplifying multiplexed analog signals from multiplexing means to an optimum gain level for further operations to be performed therewith, said device comprising:

a continuous chain of a plurality of amplification elements of respectively predetermined fixed gain interconnected in series and with said multiplexing means connected to the input thereof, and with said amplification elements being associated with a plurality of feedback circuits and first switching means for selectively varying the gains of said amplification elements to predetermined values;

memory means for memorizing amplified voltages from said chain, associated with second switching means for applying either the multiplexed analog signals or the memorized voltages to one of said amplification elements;

plural sample and hold means making up part of said memory means and having inputs permanently connected to the outputs of said amplification elements of said chain; and selecting means adapted for effecting a selection of the condition of said first and second switching means as a function of a comparison made by said selecting means between the output voltage of said chain and two reference voltages, respectively positive and negative, generated thereby, and adapted for controlling the operation of said first and second switching means, and for controlling the operation of said sample and hold means to amplify said multiplexed analog signals to the optimum gain level for further operations.

10. A device as in claim 9 further comprising: a comparator for comparing output voltages from said chain with reference voltages; an assembly of logic elements connected to the output of said comparator and making up said selecting means for generating signals for controlling said first and second switching means in response to a control signal from said comparator; and a clock element connected to said selecting means and to said comparator to control the delivery of the control signal to the selecting means by generating cyclic pulses which define the time of delivery of said control signal.

11. A device as in claim 9, wherein said sample and hold means comprises input amplifiers with their inputs connected permanently to the respective outputs of the amplification elements of said chain, sample-and-hold switches at the outputs of said input amplifiers, memorizing capacitors and output amplifiers connected in parallel to said sample and hold switches, and with the outputs of said output amplifiers connected through said second switching means to the input of said chain.

12. A device as in claim 9, wherein said chain comprises a first amplification element and a second amplification element adapted for having their gains selectively varied between three different predetermined values by varying the condition of said first switching means, a buffer amplifier connected in series with and preceding said first and second amplification elements, and wherein said sample-and-hold means comprises three sample-and-hold units with their inputs respectively connected to the outputs of said buffer amplifiers and said first and second amplification elements, and their outputs selectively connectable through switches to the input of said first amplification element.

13. A device as in claim 2 further comprising voltage generating means associated with said chain, said selecting means, and said memory means, for generating voltages to be applied to amplified analog signals to compensate for drift or noise voltage issued by said chain.

14. A method of amplifying and sampling multiplexed analog signals to an optimum gain level for further operations to be performed therewith, comprising the steps of:

passing a multiplexed analog signal to an amplification chain of variable amplification levels;

amplifying the input analog signal to predetermined plural gain levels and applying the amplified plural gain signal to a respective plurality of sample-and-hold means;

comparing the values the amplified signal from said chain with reference voltages to determine if the amplified values is optimum, and if the amplification is not optimum as determined from said comparison;

effecting a change in the individual gains of said amplification chain to predetermined different gain levels from said first amplification and repeating said transmission to the sample and hold means, and the comparison step until the optimum level is reached.

15. A method as in claim 14, wherein said amplification and comparison are conducted through a chain of two amplifier up to four times, with the gain of each amplifier being variable between three levels.

16. A method as in claim 15 further comprising generating a compensating voltage and applying it to the optimum gain amplified signal to compensate for noise and drift voltages from said amplification chain.

* * * * *